(12) United States Patent
Hawthorne et al.

(10) Patent No.: US 10,427,439 B2
(45) Date of Patent: Oct. 1, 2019

(54) SUBSTRATE MARKING FOR SEALING SURFACES

(71) Applicant: Apple Inc., Cupertino, CA (US)

(72) Inventors: Jennifer L. Hawthorne, San Jose, CA (US); Michael J. Northrop, Cupertino, CA (US); Tristan E. Lee, San Jose, CA (US); Marwan Rammah, San Francisco, CA (US); Matthew D. Hill, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/126,984

(22) Filed: Sep. 10, 2018

(65) Prior Publication Data

US 2019/0077177 A1    Mar. 14, 2019

Related U.S. Application Data

(60) Provisional application No. 62/557,090, filed on Sep. 11, 2017.

(51) Int. Cl.
*H04M 1/00* (2006.01)
*B41M 5/24* (2006.01)
(Continued)

(52) U.S. Cl.
CPC ............. *B41M 5/24* (2013.01); *F28F 21/084* (2013.01); *F28F 21/085* (2013.01);
(Continued)

(58) Field of Classification Search
CPC ...... B41M 5/24; G06F 1/1626; G06F 1/1656; H04M 1/0202; H04M 1/0283; H04M 1/026; H05K 5/0004; H05K 5/0017; H05K 5/0086; H05K 5/0217; H05K 5/03; H05K 5/069; H05K 9/0007; H05K 7/2039; H05K 9/0075; H05K 1/147; H05K 2201/10189;
(Continued)

(56) References Cited

U.S. PATENT DOCUMENTS 5,991,155 A    11/1999   Kobayashi et al.
7,119,419 B2   10/2006   Kato et al.
(Continued)

FOREIGN PATENT DOCUMENTS

WO    2005048298 A2    5/2005

OTHER PUBLICATIONS

"Gorilla University: Quantum Induction Wireless Charging", Quantum Induction Technology—Gorilla Gadgets; https://gorillagadgets.com/blogs/gorilla-gadgets-blog/qi-quantum-induction-wireless-charging; Aug. 3, 2017, 9 pages.

*Primary Examiner* — Huy C Ho
(74) *Attorney, Agent, or Firm* — Dickinson Wright RLLP

(57) ABSTRACT

An electronic device includes a housing having an opening that includes an interior surface with a portion that is only viewable from an external vantage point at a viewing angle that is other than ninety degrees (90°). The electronic device also includes a SIM card tray that is removable from the housing via the opening and the SIM card tray includes an angled surface. Information is encoded in the form of text that is laser etched on the angled surface. The text is characterized as having an aspect ratio that corresponds to the viewing angle.

20 Claims, 8 Drawing Sheets

(51) Int. Cl.

| | | |
|---|---|---|
| *G06F 1/16* | (2006.01) | |
| *H04M 1/02* | (2006.01) | |
| *H01P 3/08* | (2006.01) | |
| *H05K 1/02* | (2006.01) | |
| *H05K 1/18* | (2006.01) | |
| *H05K 5/00* | (2006.01) | |
| *H05K 5/02* | (2006.01) | |
| *H05K 5/03* | (2006.01) | |
| *H05K 5/06* | (2006.01) | |
| *H05K 9/00* | (2006.01) | |
| *F28F 21/08* | (2006.01) | |
| *H05K 7/20* | (2006.01) | |
| *H01R 12/79* | (2011.01) | |
| *H05K 1/14* | (2006.01) | |
| *H02J 50/10* | (2016.01) | |
| *H02J 7/02* | (2016.01) | |

(52) U.S. Cl.
CPC .......... *G06F 1/1626* (2013.01); *G06F 1/1656* (2013.01); *H01P 3/08* (2013.01); *H04M 1/0202* (2013.01); *H05K 1/0216* (2013.01); *H05K 1/181* (2013.01); *H05K 5/0004* (2013.01); *H05K 5/0017* (2013.01); *H05K 5/0086* (2013.01); *H05K 5/0217* (2013.01); *H05K 5/03* (2013.01); *H05K 5/069* (2013.01); *H05K 7/2039* (2013.01); *H05K 9/0007* (2013.01); *H05K 9/0075* (2013.01); *H01R 12/79* (2013.01); *H02J 7/025* (2013.01); *H02J 50/10* (2016.02); *H04M 1/026* (2013.01); *H04M 1/0283* (2013.01); *H05K 1/147* (2013.01); *H05K 2201/10189* (2013.01)

(58) Field of Classification Search
CPC ...... F28F 21/084; F28F 21/085; H01R 12/79; H02J 50/10; H02J 7/025
USPC ...................................................... 455/575.1
See application file for complete search history.

(56) References Cited

U.S. PATENT DOCUMENTS

| | | | |
|---|---|---|---|
| 7,292,441 | B2 | 11/2007 | Smalc et al. |
| 7,583,834 | B2* | 9/2009 | McCollough ....... G03F 7/70791 |
| | | | 250/492.2 |
| 7,652,729 | B2 | 1/2010 | Minaguchi et al. |
| 7,760,289 | B2 | 7/2010 | Nakanishi et al. |
| 8,110,744 | B2 | 2/2012 | Wong et al. |
| 8,281,483 | B2 | 10/2012 | Hofmann et al. |
| 8,669,483 | B2 | 3/2014 | Shimura et al. |
| 8,740,634 | B2 | 6/2014 | Uesaka et al. |
| 8,762,749 | B2 | 6/2014 | Azancot et al. |
| 8,960,818 | B2* | 2/2015 | Myers .................... G06K 13/08 |
| | | | 312/319.2 |
| 9,143,586 | B2 | 9/2015 | Allore et al. |
| 9,380,714 | B2 | 6/2016 | Shin et al. |
| 9,469,469 | B2 | 10/2016 | Rayner |
| 9,583,256 | B2 | 2/2017 | Lapetina et al. |
| 9,601,286 | B2 | 3/2017 | Lynch et al. |
| 9,973,013 | B2 | 5/2018 | Yon |
| 10,003,371 | B1 | 6/2018 | Given et al. |
| 10,218,830 | B1 | 2/2019 | Liu et al. |
| 2003/0066672 | A1 | 4/2003 | Watchko et al. |
| 2008/0151503 | A1 | 6/2008 | Aapro et al. |
| 2008/0164840 | A1 | 7/2008 | Kato et al. |
| 2010/0072952 | A1 | 3/2010 | Nakajima |
| 2012/0234524 | A1 | 9/2012 | Fan et al. |
| 2013/0033581 | A1 | 2/2013 | Woo et al. |
| 2014/0177197 | A1 | 6/2014 | Lampinen |
| 2014/0192467 | A1 | 7/2014 | Kwong |
| 2014/0367369 | A1* | 12/2014 | Nashner ................... B41M 5/24 |
| | | | 219/121.66 |
| 2015/0111623 | A1* | 4/2015 | Hegemier ........... H04M 1/0283 |
| | | | 455/575.1 |
| 2015/0198864 | A1 | 7/2015 | Havskjold et al. |
| 2017/0085764 | A1 | 3/2017 | Kim et al. |
| 2018/0053981 | A1 | 2/2018 | Bae et al. |
| 2018/0084680 | A1 | 3/2018 | Jarvis et al. |
| 2018/0190408 | A1 | 7/2018 | Chin |
| 2019/0041909 | A1 | 2/2019 | Pakula et al. |
| 2019/0082083 | A1 | 3/2019 | Jarvis et al. |

* cited by examiner

SUBSTRATE MARKING FOR SEALING SURFACES

CROSS-REFERENCE TO RELATED APPLICATIONS

The present application claims the benefit of U.S. Provisional Application No. 62/557,090, entitled "PORTABLE ELECTRONIC DEVICE," filed Sep. 11, 2017, the content of which is incorporated herein by reference in its entirety for all purposes.

This patent application is also related and incorporates by reference in their entirety each of the following co-pending patent applications:
(i) U.S. patent application Ser. No. 16/127,043 entitled "THERMALLY CONDUCTIVE STRUCTURE FOR DISSIPATING HEAT IN A PORTABLE ELECTRONIC DEVICE" by HOOTON et al. filed Sep. 10, 2018;
(ii) U.S. patent application Ser. No. 16/127,055 entitled "PLATE FOR MAGNETIC SHIELDING OF AN OPERATIONAL COMPONENT IN A PORTABLE ELECTRONIC DEVICE" by WAH et al. filed Sep. 10, 2018;
(iii) U.S. patent application Ser. No. 16/127,064 entitled "STRUCTURES FOR SECURING OPERATIONAL COMPONENTS IN A PORTABLE ELECTRONIC DEVICE" by RAMMAH et al. filed Sep. 10, 2018; and
(iv) U.S. patent application Ser. No. 16/127,071 entitled "SPACE-EFFICIENT FLEX CABLE WITH IMPROVED SIGNAL INTEGRITY FOR A PORTABLE ELECTRONIC DEVICE" by SLOEY et al. filed Sep. 10, 2018.

FIELD

The following description relates to an electronic device. In particular, the following description relates to a portable electronic device (e.g., smartphone) having various features and enhancements.

BACKGROUND

Portable electronic devices are known to include a housing and a cover glass that combines with the housing to enclose components such as a circuit board, a display, and a battery. Also, portable electronic devices are known to communicate over a network server to send and receive information, as well as communicate with a network carrier to send and receive voice communication.

SUMMARY

An electronic device is described. The electronic device includes a housing having a surface and a recess that extends from the surface. The recess having walls that extend to a terminus surface and the walls are observable only from a location that is outside of the housing at a viewing angle that is non-orthogonal to the surface. The electronic device also includes a mark having physical characteristics corresponding to being laser etched at the viewing angle. When the mark is observed at the viewing angle, the mark has an appearance corresponding to being laser etched at an angle that is orthogonal to the surface.

An electronic device includes a housing having an opening that includes an interior surface having a portion that is only viewable from an external vantage point at a viewing angle that is other than ninety degrees (90°) and a SIM card tray that is removable from the housing via the opening. The SIM card tray including an angled surface and information encoded in the form of text that is laser etched on the angled surface, wherein the text is characterized as having an aspect ratio that corresponds to the viewing angle.

A method for using a laser to inscribe textual information at a surface of a substrate that is only viewable from a vantage point having an angular displacement that is other than ninety degrees (90°) relative to the surface is described. The method is carried out by performing at least the following steps: positioning a laser capable of projecting a laser beam towards the surface at the angular displacement, projecting the laser beam at the surface at the angular displacement, causing the laser beam to impinge the substrate at the surface. It should be noted that the laser beam inscribes the textual information at the surface by altering a reflective characteristic of the surface. Moreover, the textual information has a contrast ratio and a line width in accordance with the angular displacement.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which.

Figure 1:
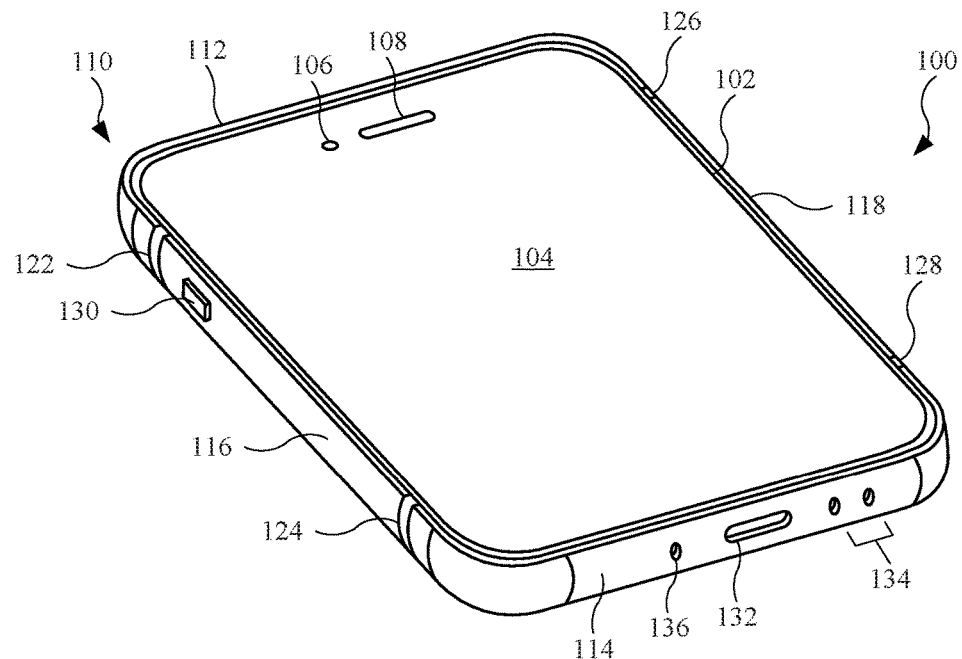
FIG. 1 illustrates a front isometric view of an embodiment of an electronic device, in accordance with some described embodiments.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

The following disclosure relates to an electronic device, such as a mobile communication device that takes the form of a smart phone or a tablet computer device. The electronic device can also have a form factor making the electronic device suitable for wearable applications. By wearable it is meant that the electronic device can be worn by a user by way of a strap, a wristband, or any other suitable attachment mechanism. It should be noted that the electronic device can include several enhancements and modifications not found on traditional electronic devices. For example, the electronic device may include a protective cover (transparent material) and a display assembly coupled to the protective cover, with the display assembly extending to the edges (or at least substantially to the edges) of the protective cover, thereby providing an "edge to edge" appearance of the display assembly as visual information (textual, still images, or motion images, i.e., video) are seen at or near the edges of the protective cover. The electronic device can also have operational components enclosed within and carried by a housing. The housing can have recesses or other features some of which can have surfaces that can be suitable for application of identifying marks, or indicia. The identifying marks can include information such as a serial number, a model number, textual information related to an owner of the product, and so on. It is therefore imperative that the identifying marks be legible and readily viewable. However, for cosmetic purposes, the identifying marks can be viewable at only a specific viewing angle, or range of viewing angles. In this way, the identifying marks will be less likely to adversely affect an aesthetic appearance of the electronic device. Therefore, a surface (or surfaces) of the housing that is not readily viewable (such as interior surfaces of a recess or other housing feature) can be used for application of the identifying marks. In this way, the identifying marks can be generally visible at line of sight having a pre-determined viewing angle(s) with respect to a normal of the surface. In this way, the identifying information is viewable when needed yet does not detract from the overall aesthetic appearance of the electronic product.

In one embodiment, a laser can be used to laser mark a surface at an angle corresponding to a viewing angle. In this regard, the surface can be generally hidden from view except when viewed at the viewing angle(s). For example, the housing can include a recess having internal walls that cannot be viewed "head on" (i.e., viewing angle is about normal, 90°, to the surface) but can nonetheless be viewed at an angle other than normal. Accordingly, a laser used to provide a laser beam used to laser mark the surface can be directed at a laser angle corresponding to the viewing angle. In this way, the laser marks can be viewed at the viewing angle without apparent distortion. It should also be noted that the quality of the laser mark can be a function of various factors, such a contrast (difference in reflected luminosity between the text and background), line width, color (based upon type of substrate material), and so on.

These and other embodiments are discussed below with reference to FIGS. 1-8. However, those skilled in the art will readily appreciate that the detailed description given herein with respect to these Figures is for explanatory purposes only and should not be construed as limiting.

FIG. 1 illustrates a front isometric view of an embodiment of an electronic device 100, in accordance with some described embodiments. In some embodiments, the electronic device 100 is a tablet computer device. In the embodiment shown in FIG. 1, the electronic device 100 is a mobile wireless communication device (a smartphone, for example). The electronic device 100 may include a band 102 that extends defines an outer perimeter of the electronic device 100. The band 102 may include a metal, such as aluminum, stainless steel, or an alloy that includes at least one of aluminum or stainless steel. The band 102 may be composed of several sidewall components, such as a first sidewall component 104, a second sidewall component 106, a third sidewall component 108 (opposite the first sidewall component 104), and a fourth sidewall component (not shown in FIG. 1). The aforementioned sidewall components may include any material(s) previously described for the band 102.

In some instances, some of the sidewall components form part of an antenna assembly (not shown in FIG. 1). As a result, a non-metal material, or materials, may separate the sidewall components of the band 102 from each other in order to electrically isolate the sidewall components. For example, a first composite material separates the first sidewall component 104 from the second sidewall component 106, and a second composite material separates the second sidewall component 106 from the third sidewall component 108. The aforementioned composite may include an electrically inert, or insulating, material(s), such as plastics and/or resin, as non-limiting examples.

The electronic device 100 may further include a display assembly 116 (shown as a dotted line) that is covered by a protective cover 118. The display assembly 116 may include multiple layers (discussed below), with each layer providing a unique function. The display assembly 116 may be partially covered by a border 120, or frame, that extends along an outer edge of the protective cover 118 and partially covers an outer edge of the display assembly 116. The border 120 can be positioned to hide or obscure any electrical and mechanical connections between the layers of the display assembly 116 and flexible circuit connectors. This will be shown below. Also, the border 120 may include uniform thickness. For example, the border 120 may include a thickness that generally does not change in the X- and Y-dimensions.

Also, as shown in FIG. 1, the display assembly 116 may include a notch 122, representing an absence of the display assembly 116. The notch 122 may allow for a vision system (discussed below) that provides the electronic device 100 with information for object recognition, such as facial recognition. In this regard, the electronic device 100 may include a masking layer with openings (shown as dotted lines) designed to hide or obscure the vision system, while the openings allow the vision system provide the object recognition information. This will be further discussed below. Also, the protective cover 118 may be formed from a transparent material, such as glass, plastic, sapphire, or the like. In this regard, the protective cover 118 may be referred to as a transparent cover, a transparent protective cover, or a cover glass (when the protective cover 118 includes glass).

As shown in FIG. 1, the protective cover 118 includes an opening 124, which may represent a single opening of the protective cover 118. The opening 124 may allow for transmission of acoustical energy (in the form of audible sound) into the electronic device 100, which may be received by a microphone (not shown in FIG. 1) of the electronic device 100. Further, the opening 124 may allow for transmission of acoustical energy (in the form of audible sound) out the electronic device 100, which may be generated by an audio module (not shown in FIG. 1) of the electronic device 100. Also, the electronic device 100 may not include a button, such as "home button," commonly found in electronic devices, as the protective cover 118 does not include additional openings.

The electronic device 100 may further include a port 126 designed to receive a connector of a cable assembly. The port 126 allows the electronic device 100 to communication data information (send and receive), and also allows the electronic device 100 to receive electrical energy to charge a battery assembly (not shown in FIG. 1). Accordingly, the port 126 may include terminals (not shown in FIG. 1) that electrically couple to the connector.

Also, the electronic device 100 may include several openings. For example, the electronic device 100 may include openings 128 that allow an additional audio module (not shown in FIG. 1) of the electronic device to emit acoustical energy out of the electronic device 100. The electronic device 100 may further include openings 132 that allow an additional microphone (not shown in FIG. 1) of the electronic device to receive acoustical energy. Also, the electronic device 100 may include a first fastener 134 and a second fastener 136 designed to secure with a rail (not shown in FIG. 1) that is coupled to the protective cover 118. In this regard, the first fastener 134 and the second fastener 136 are designed to couple the protective cover 118 with the band 102.

The electronic device 100 may include several control inputs designed to provide a command to the electronic device 100. For example, the electronic device 100 may include a first control input 142 and a second control input 144. The aforementioned control inputs may be used to adjust the visual information presented on the display assembly 116 or the volume of acoustical energy output by an audio module, as non-limiting examples. The controls may include one of a switch or a button designed to generate a command to a processor circuit (not shown in FIG. 1). The control inputs may at least partially extend through openings in the sidewall components. For example, the second sidewall component 106 may include an opening 146 that receives the first control input 142.

Figure 2:
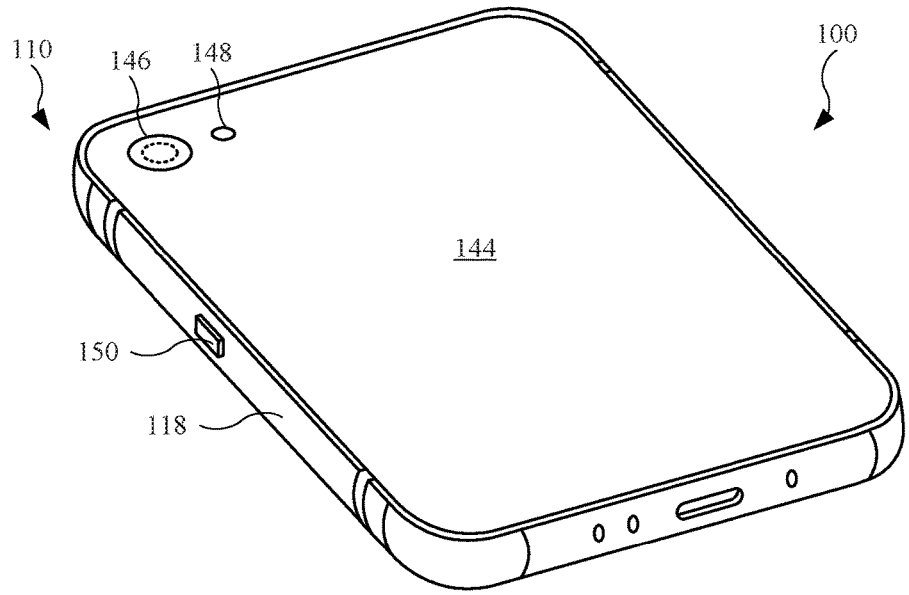
FIG. 2 illustrates a rear isometric view of the electronic device shown in FIG. 1.

FIG. 2 illustrates a rear isometric view of the electronic device 100 shown in FIG. 1. In addition to the aforementioned sidewall components, the band 102 may further include a fourth sidewall component 110. As shown, a third composite material 152 separates the first sidewall component 104 from the fourth sidewall component 110, and a fourth composite material 154 separates the fourth sidewall component 110 from the third sidewall component 108.

The electronic device 100 may further include a protective cover 158 that couples with the band 102. In this regard, the protective cover 158 may combine with the band 102 to form an enclosure of the electronic device 100, with the enclosure (band 102 and protective cover 158) defining an internal volume that carries several internal components, such as a battery assembly, circuit board assembly, vision system, as non-limiting examples. The protective cover 158 may include any material(s) previously described for the protective cover 108 (shown in FIG. 1). When the protective cover 158 include a non-metal material, the electronic device 100 may provide hardware (and software) to support wireless charging. For example, the electronic device 100 may include a wireless power receiving module 160 (represented by a dotted line) covered by the protective cover 158. The wireless power receiving module 160 is designed to receive an induced current when exposed to an alternating electromagnetic field. This will be further discussed below. Also, the protective cover 118 (shown in FIG. 1) may be referred to as a "front protective cover" and the protective cover 158 may be referred to as a "rear protective cover," as the front of the electronic device 100 is generally associated with the display assembly 116 (which is covered by the protective cover 118), and the back of the electronic device 100 is generally associated with a rear wall, such as the protective cover 158.

The electronic device 100 may further include a camera assembly 170, which may include a dual camera assembly. As shown, the camera assembly 170 may include a first camera module 172, a second camera module 174, and a light emitter 176 positioned between the first camera module 172 and the second camera module 174. The light emitter 176 is designed to provide additional lighting during an image capture event by the first camera module 172 and/or the second camera module 174. However, it is desired to isolate some of the light "leakage" from the light emitter into the first camera module 172 and the second camera module 174. In this regard, the camera assembly 170 may further include a trim element (not shown in FIG. 1) designed to optically isolate the light emitter 176 from the first camera module 172 and the second camera module 174. In this manner, the first camera module 172 and the second camera module 174 may only receive desired light from the light emitter 176, such as light reflected from an object, the image of which is the first camera module 172 and/or the second camera module 174). The trim element will be further shown and described below. Also, the camera assembly 170 may further include a protective cover 178 formed from a transparent material that covers the first camera module 172, the second camera module 174, and the light emitter 176. However, the protective cover 178 may include a masking layer (not shown in FIG. 2) designed to at least partially obscure part of protective cover the first camera module 172, the second camera module 174, and the light emitter 176. It should be noted, however, that the masking layer includes openings that allow the first camera module 172 and the second camera module 174 to capture images, and that allow the light emitter 176 to emit light that exits the electronic device 100. Also, as shown in FIG. 2, the first camera module 172 and the second camera module 174 are aligned (collectively) in a manner that is parallel with respect to the second sidewall component 106 (shown in FIG. 1) and the fourth sidewall component 110. In other words, an imaginary line can be drawn through the first camera module 172 and the second camera module 174 that is parallel with respect the second sidewall component 106 (shown in FIG. 1) and the fourth sidewall component 110.

Figure 3A:
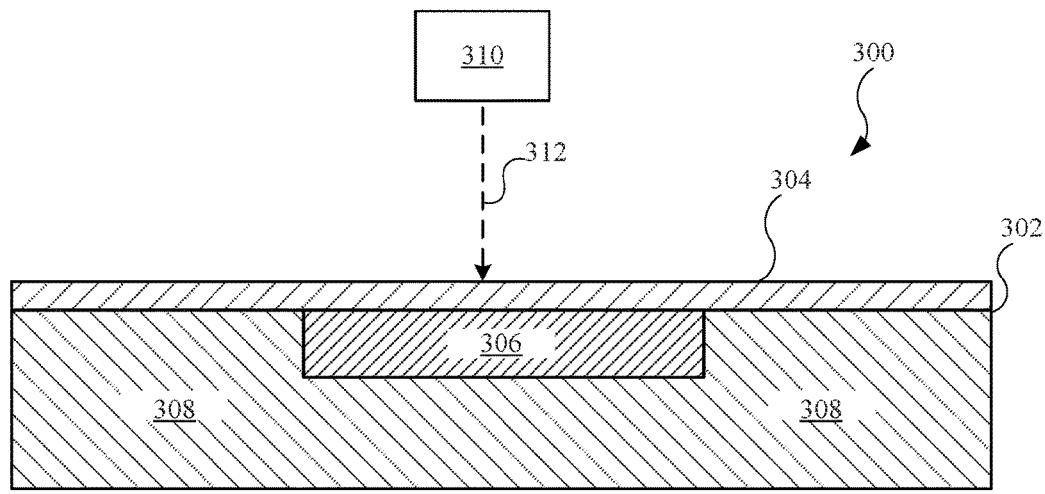
FIGS. 3A-3E illustrate a marked substrate in accordance with the described embodiments.
Figure 3B:
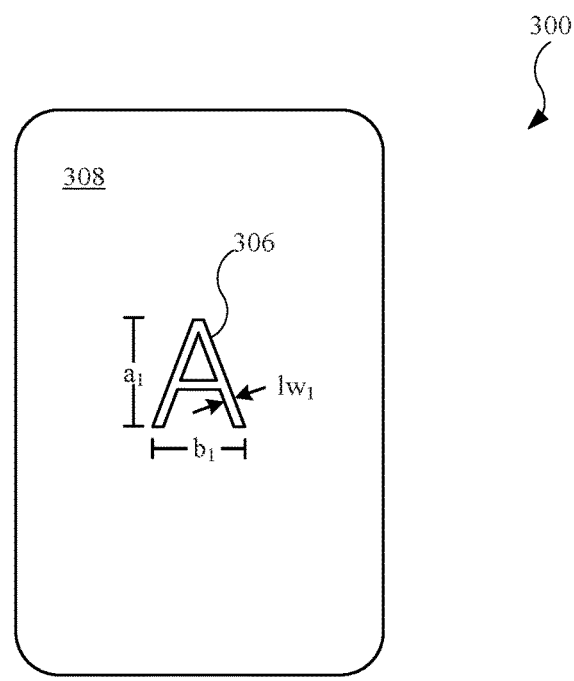

FIG. 3A illustrates substrate 300 that, in one embodiment, can have surface 302 that is overlaid by anodic oxide layer 304. In some embodiments, substrate 300 can include portion 306 having optical characteristics that have been altered in such a way that portion 306 is rendered visually distinct from a remaining unaltered portion 308 of substrate 300. In some cases, altered portion 306 can take the form of an indicia (such as text, symbol, number, etc.) that can be observed through anodic oxide layer 304 at a "head on"

angle. By head on angle it is meant an angle at which altered portion 304 is viewed such that any indicia have observed characteristics (such as aspect ratio, line width, etc.) that are consistent with baseline characteristics. In this case, portion 306 has been altered using laser 310 that provides laser beam 312 directed towards substrate 300 at the "head on" angle of 90°. For example, as shown in FIG. 3B, the letter "A" is formed using laser beam 312 from laser 310 that passes through anodic layer 304 at an angle of 90° (that also that corresponds to viewing angle of 90°). In this way, as shown in FIG. 3B, altered portion 306 takes on the appearance of a capital letter "A" in block form having a baseline height $a_1$ and a baseline width $b_1$ resulting in the capital letter "A" having baseline aspect ratio AR1 ($b_1/a_1$) and baseline line width LW ($lw_1$). It should be noted that in general a laser beam produces a circular spot when the impingement angle of the laser beam (i.e., the angle between the impinged surface and the laser) is orthogonal to surface 302. In this way, the line width and aspect ratio can be associated with the diameter of the circular spot. However, when the impingement angle is other than orthogonal, the laser spot becomes an ellipse having a major axis that is greater than the diameter and a minor axis that is less than the diameter that take together gives the resultant image a "stretched out" appearance.

Figure 3C:
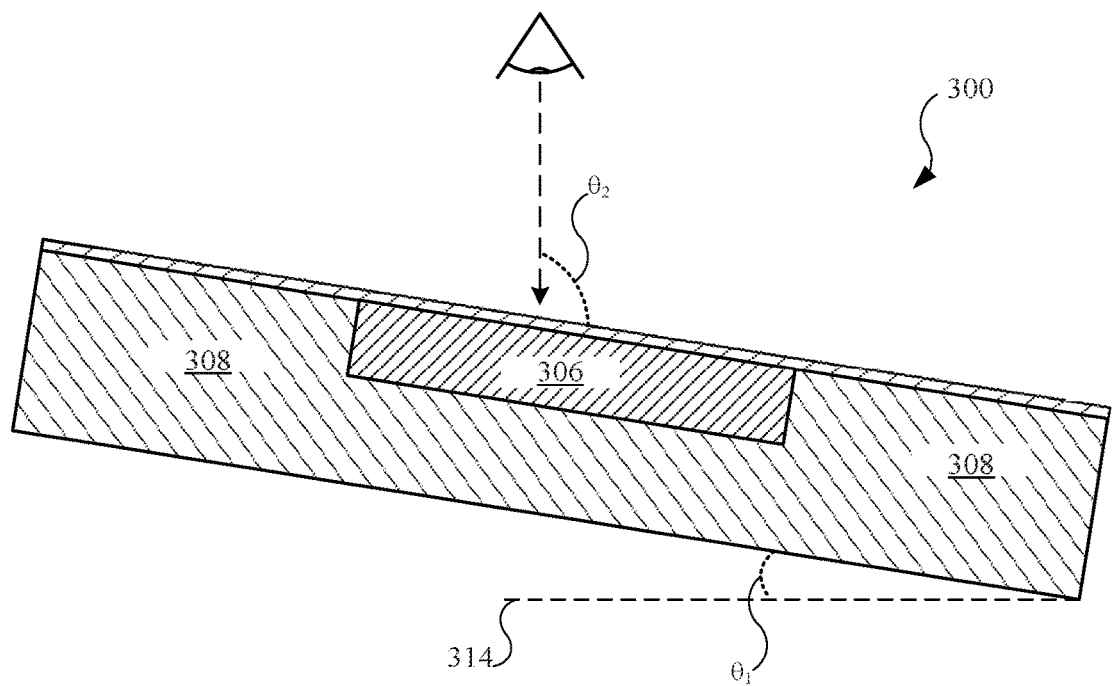
Figure 3D:
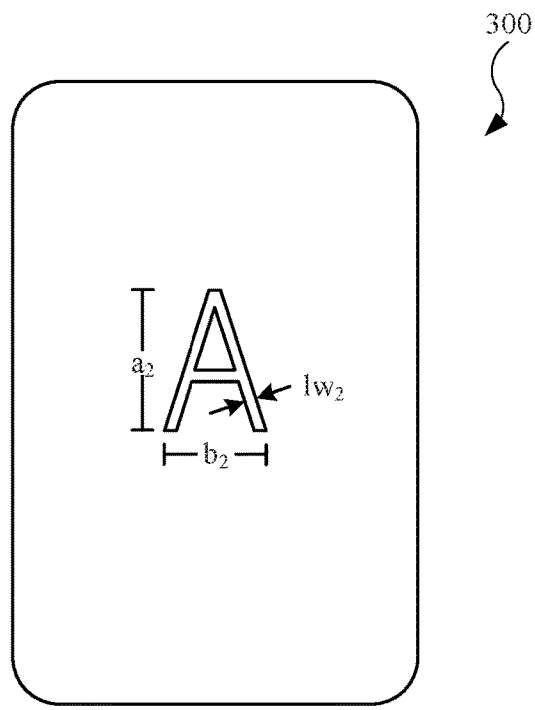

FIG. 3C illustrates an embodiment whereby substrate 300 is angularly displaced by angle θv from the horizontal whilst the direction of the laser beam and the viewing angle remain unchanged with respect to horizontal plane 314. In this case, angle $θ_2$ is about (90−$θ_1$)° resulting in the letter "A" having altered visual characteristics in accordance with height $a_2$ and width $b_2$. In this case, letter "A" will have aspect ratio $AR_2$ ($b_2/a_1$) and line width $lw_2$ as shown in FIG. 3D, where $a_1$, $b_1$, $lw_1$ will appear to be different than $a_2$, $b_2$, $lw_2$.

Figure 3E:
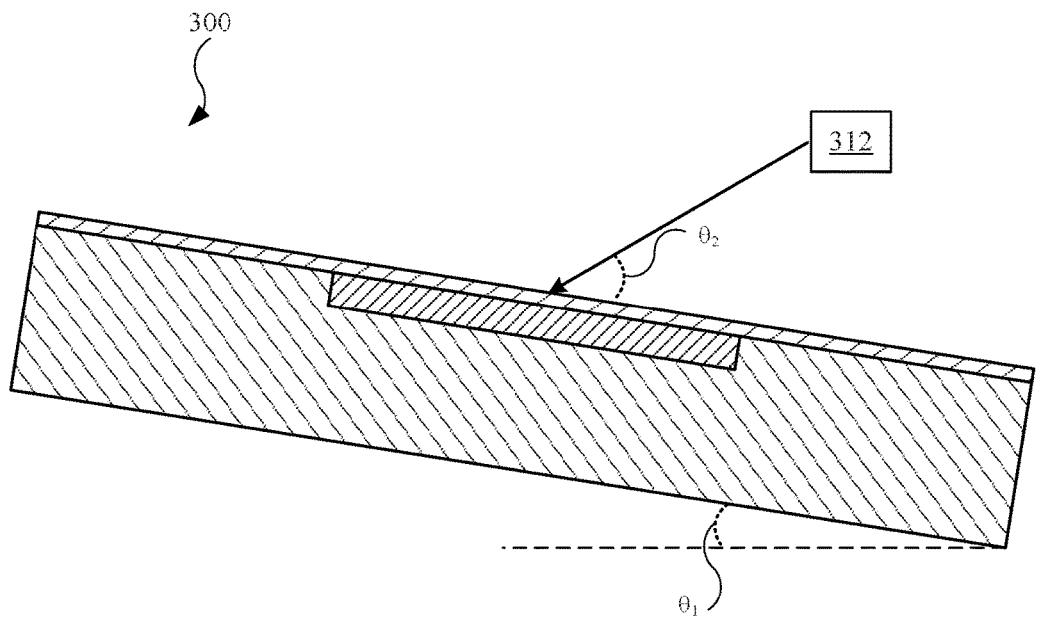
Figure 4:
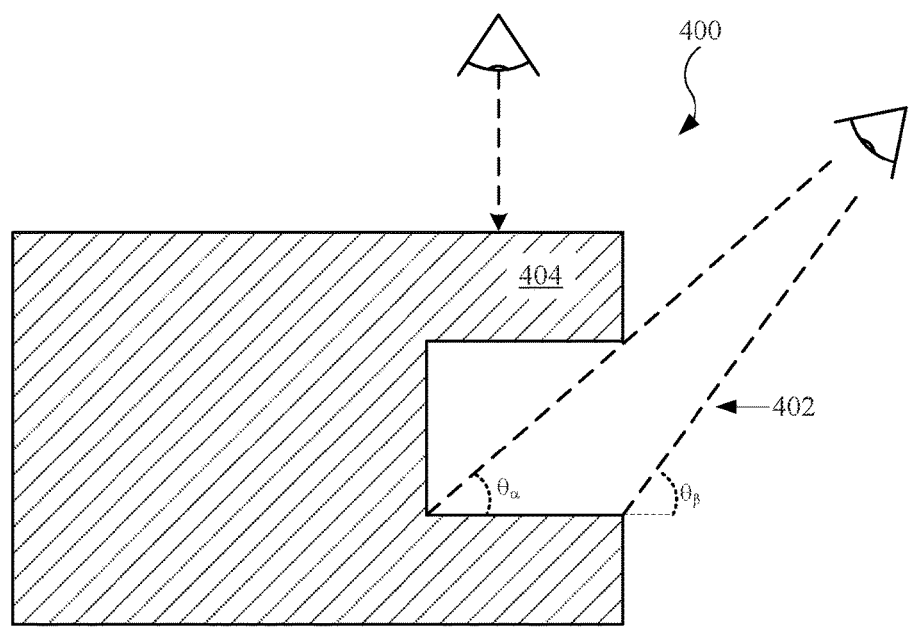
FIG. 4 illustrates a substrate having a recess with a surface that is not directly viewable.
Figure 5:
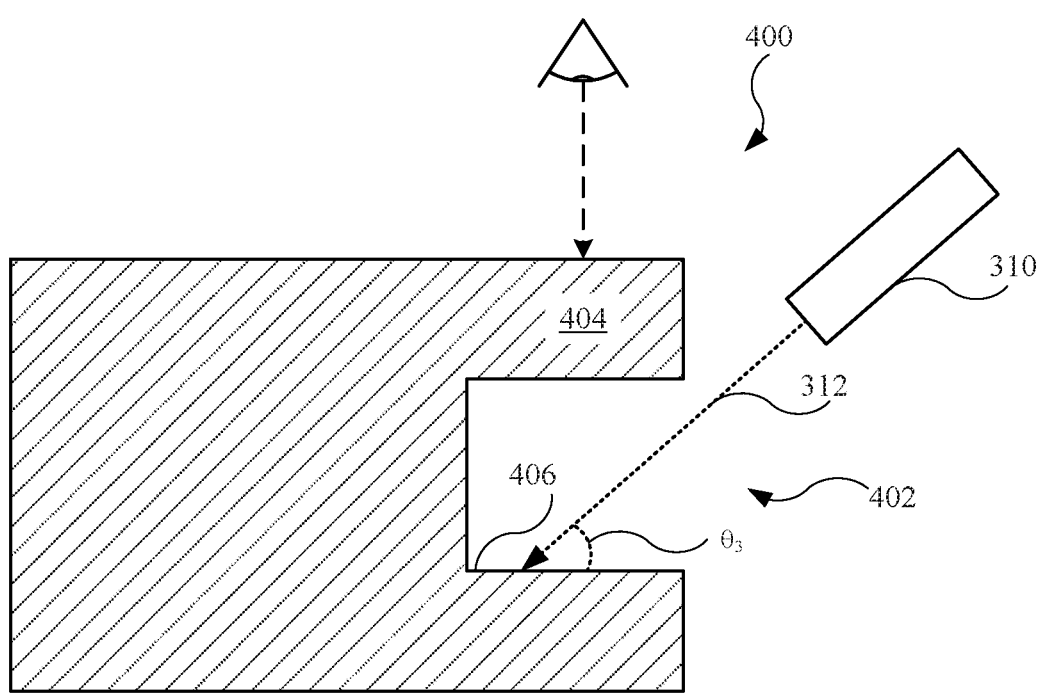
FIG. 5 illustrates the substrate of FIG. 4 having the surface marked with a laser.
Figure 6:
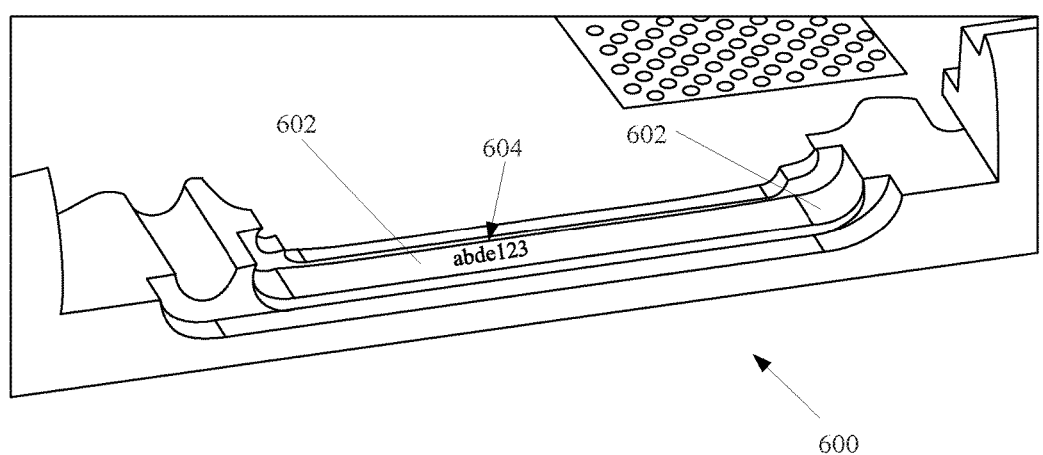
FIG. 6 illustrates laser marking near or on a recess capable of receiving a SIM card.

Therefore, in order to restore the visual characteristics to those in accordance with the "head on" view even though substrate 300 is angularly displaced from horizontal surface 314, the viewing angle and the angle of the laser that forms altered portion 306 can be aligned to be generally the same, as illustrated in FIG. 3E. In this case, the apparent aspect ratio and line width can be $AR_1$ and $lw_1$, respectively. This arrangement is particularly useful in those situations shown in FIG. 4 showing housing 400 having a recess 402 that having wall 404 that blocks a head on view of surface 406 and therefore can only be viewed within a range of viewing angles ($θ_a$, $θ_b$) other than 90°. For example, as shown in FIG. 5, surface 406 can be part of recess 402 having wall 404, a portion of surface 406 is to be laser etched by laser 310 using laser beam 312 the effects of which can only be viewed at viewing angle $θ_v$ that is other than 90° (since surface 406 is blocked from "head on" view by wall 404). Accordingly, laser 310 can be positioned such that laser beam 312 impinges surface 406 at impingement angle $θ_3$ (that matches viewing angle θv). In this way, when viewed at viewing angle θv, the visual appearance of any character encoded in altered portion 306 of surface 406 can appear as if the character was formed and viewed at the head on angle of 90°.

In a specific case, markings may be made on a sealing surface of a recess capable of receiving, for example, SIM tray. However, this surface, as well as other surfaces, are at an angle. Thus, as is described with respect to FIG. 6, a laser etching technique can be used where the laser is configured to etch text while directed an angle to the surface being etched that corresponds to the viewing angle. For example, recess 600 is capable of receiving a SIM tray (not shown), multiple surfaces 602 may be candidates to receive laser etched text. The surfaces 602 may have a substrate base and be covered with an anodization layer (aluminum oxide layer), such that the laser etching is configured to etch the text under the anodization layer covering. However, these surfaces 602 are oriented at an angle that is oblique to the laser etching device. If the text were etched without elongation, then it will be distorted to the viewer and otherwise may be difficult to read. Thus, using the techniques described above, the resultant text 604 can be easily read at the viewing angle.

Figure 7:
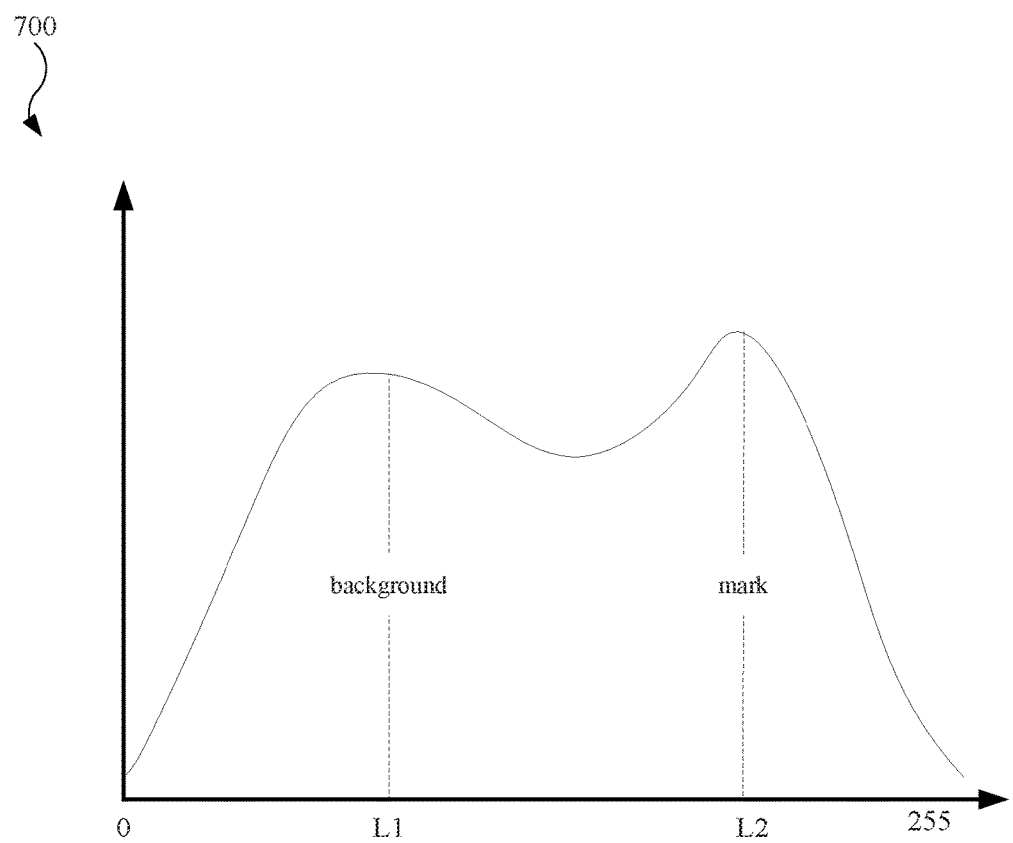
FIG. 7 shows a histogram of a laser marked surface.

FIG. 7 shows histogram 700 illustrating the luminance (L) variation of a laser ablated portion and a background portion. As shown, background portion (represented by portion 308) is generally unaffected by the laser and therefore retains a baseline luminance variation having a peak at L1 whereas the laser ablated portion (portion 306) corresponding to the indicia (such as A) can have a luminance histogram having a peak value of L2. It should be noted that a contrast ratio between the background and the indicia can be associated with a ratio of background peak luminance (L1) and indicia peak luminance L2) such that a contrast difference can be defined by Eq. (1):

$$C.R.=L2-L1. \qquad \text{Eq. (1)}$$

In one embodiment, a legibility of the mark is characterized by at least as a function of both the contrast ratio and the line width.

Figure 8:
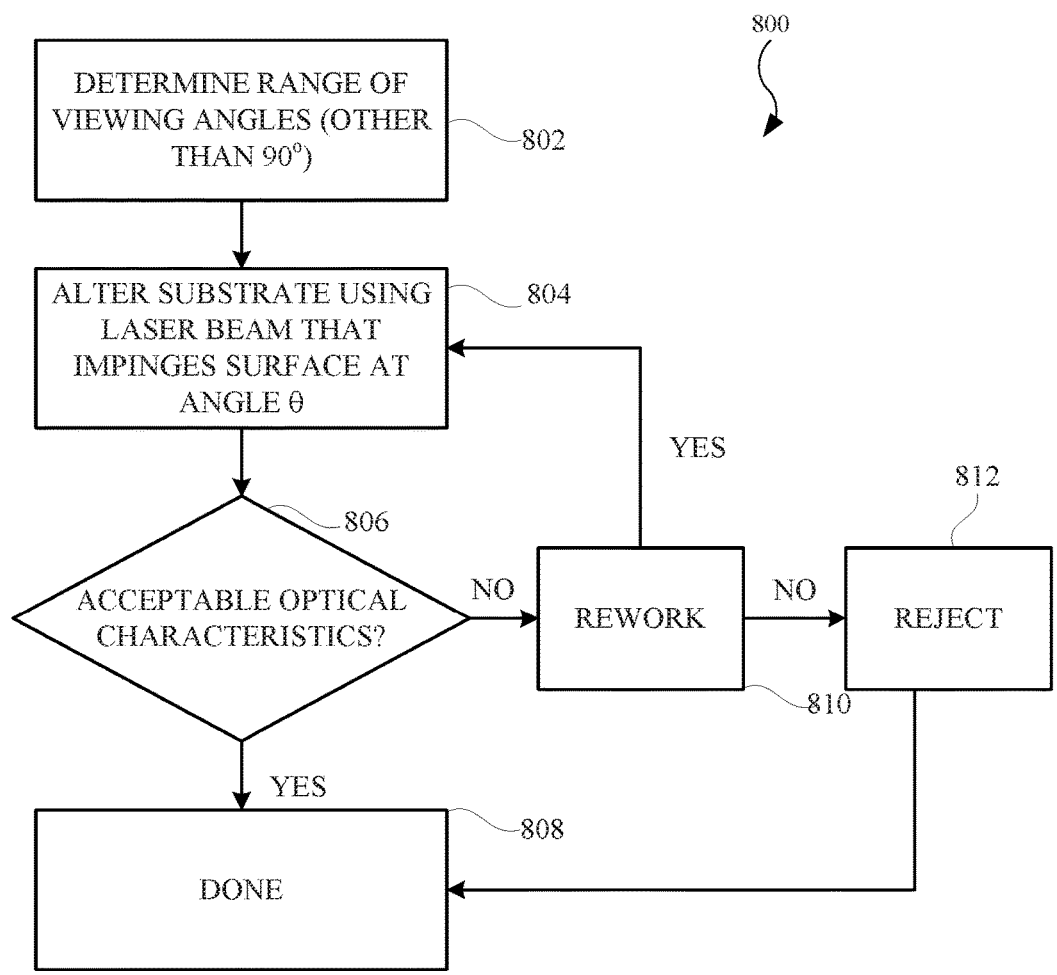
FIG. 8 illustrates a flowchart of steps in a method for laser marking a contoured surface of a housing of a portable electronic device.

FIG. 8 is a flowchart 800 of steps in a method in accordance with the described embodiments. At step 802, a range of viewing angles (that are other than 90°) of a substrate to be marked is determined. At 804, at least a portion of the substrate is altered using, for example, a laser beam that impinges the surface at an impingement angle that is within the range of viewing angles. At 806. if the optical characteristics of the altered portion of the substrate are acceptable, then the method is done at 808, otherwise, at 810, if the substrate can be reworked, then the substrate is returned to 804, otherwise, the substrate is rejected at 812, and the method is done at 808.

An electronic device, includes a housing having a substrate that includes a surface that is overlaid by an anodic oxide layer, wherein the surface is directly viewable through the anodic oxide layer from a location that is outside the housing and at a viewing angle that is other than orthogonal to the surface and a mark at the surface, the mark having an aspect ratio and a line width in accordance with the viewing angle such that the mark, when viewed at the viewing angle, has an apparent aspect ratio and an apparent line width that corresponds to viewing the mark at a viewing angle that is orthogonal to the surface. In one embodiment, the anodic oxide layer is sufficiently transparent that a laser beam is capable of passing from an external surface of the anodic oxide layer to the substrate surface, wherein the laser beam is incident upon the anodic oxide layer at the viewing angle. In one embodiment, the mark is formed at the substrate surface by moving the laser beam in a controlled manner such that the laser beam alters a portion of the substrate surface on which the laser beam impinges, wherein the altered portion of the substrate surface is visibly distinct from an unaltered portion and is characterized by a contrast ratio and a line width. In one embodiment, the contrast ratio is a ratio of a luminance of the altered portion and a luminance of the unaltered portion of the substrate surface. In one embodiment, a legibility of the mark is characterized by at least as a function of both the contrast ratio and the line width. In one embodiment the electronic device includes an opening that is at least partially defined by the substrate surface. In one embodiment, the opening is capable of accommodating a SIM card tray that is removable through the opening, wherein the SIM card tray includes an angled surface. In one embodiment, the SIM card tray further includes text on the angled surface, the text having an aspect ratio corresponding to a contour of the angled surface. In one embodiment, the viewing angle is within a range of viewing angles exclusive of 90°.

An electronic device, includes a housing that include an opening that includes an interior surface having a portion that is only viewable from an external vantage point at a viewing angle that is other than ninety degrees (90°), a SIM card tray that is removable from the housing via the opening, the SIM card tray including an angled surface, and information encoded in the form of text that is laser etched on the angled surface, wherein the text is characterized as having an aspect ratio that corresponds to the viewing angle. In one embodiment, legibility of the text is based upon at least a line width of the text and a contrast ratio of the text. In one embodiment, the contrast ratio comprises a difference in reflected luminosity between the laser etched text and a background region that is unaffected by the laser beam. In one embodiment, a preferred lined width is within a range of line widths from a first line width that is not readily visible at the viewing angle and a second line width, the second line width being such that two adjacent lines appear to merge. In one embodiment, the information includes at least one of a serial number, or a model number, or a part number.

A method for using a laser to inscribe textual information at a surface of a substrate that is only viewable from a vantage point having an angular displacement that is other than ninety degrees (90°) relative to the surface is described. The method includes at least: positioning a laser capable of projecting a laser beam towards the surface at the angular displacement, projecting the laser beam at the surface at the angular displacement, causing the laser beam to impinge the substrate at the surface, wherein the laser beam inscribes the textual information at the surface by altering a reflective characteristic of the surface, the textual information has a contrast ratio and a line width in accordance with the angular displacement. In one embodiment, the laser is a pulse modulated UV type laser. In one embodiment, the contrast ratio corresponds to an energy of the laser and a frequency of the pulse modulation. In one embodiment, an anodic oxide layer overlays the surface. In one embodiment, the anodic oxide layer is sufficiently transparent to the laser beam such that the laser beam is capable of passing through the anodic oxide layer to impinge the surface. In one embodiment, the information includes at least one of a serial number, or a model number, or a part number.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. An electronic device, comprising:
a housing having a surface and a recess that extends from the surface, the recess having walls that extend to a terminus surface, wherein the walls are observable only from a location that is outside of the housing at a viewing angle that is non-orthogonal to the surface; and
a mark laser etched on at least one wall and having physical characteristics corresponding to a laser beam impinging the at least one wall at the viewing angle, wherein when the mark is observed at the viewing angle, the mark has an appearance corresponding to the laser beam impinging the surface at an angle that is orthogonal to the surface.

2. The electronic device as recited in claim 1, wherein the appearance of the mark is characterized by at least one of a line width and an aspect ratio.

3. The electronic device as recited in claim 2, wherein the mark corresponds to a laser altered portion of the surface characterized by a contrast ratio.

4. The electronic device as recited in claim 3, wherein the contrast ratio is a difference in luminosity of light reflected from an unaltered portion and the altered portion of the surface.

5. The electronic device as recited in claim 4, wherein a legibility of the mark is characterized by a function of both the contrast ratio and the line width.

6. The electronic device as recited in claim 1, wherein the electronic device includes an opening in the surface.

7. The electronic device as recited in claim 6, wherein the opening is capable of accommodating a SIM card tray that is removable through the opening, wherein the SIM card tray includes an angled surface.

8. The electronic device as recited in claim 7, wherein the SIM card tray further includes text on the angled surface, the text having an aspect ratio and a line width corresponding to a contour of the angled surface.

9. The electronic device as recited in claim 1, wherein the viewing angle is within a range of viewing angles exclusive of 90°.

10. An electronic device, comprising:
a housing having an opening that includes an angled surface having a portion that is only viewable from an external vantage point at a viewing angle that is other than ninety degrees (90°);
a SIM card tray that is removable from the housing via the opening, the SIM card tray including the angled surface; and
information encoded as text that is laser etched on the angled surface, wherein the text is characterized as having an aspect ratio and line width that corresponds to the viewing angle of 90°.

11. The electronic device as recited in claim 10, wherein legibility of the text is based upon at least a line width of the text and a contrast ratio of the text.

12. The electronic device as recited in claim 11, wherein the contrast ratio comprises a difference in reflected luminosity between the text and a background region that is unaffected by the laser.

13. The electronic device as recited in claim 10, wherein a preferred lined width is within a range of line widths from a first line width that is not readily visible at the viewing angle and a second line width, the second line width being such that two adjacent lines appear to merge.

14. The electronic device as recited in claim 10, wherein the information includes at least one of a serial number, or a model number, or a part number.

15. A method for using a laser to inscribe textual information at a surface of a substrate that is only viewable from a vantage point having an angular displacement that is other than ninety degrees (90°) relative to the surface, the method comprising:

positioning a laser capable of projecting a laser beam towards the surface at the angular displacement;

projecting the laser beam at the surface at the angular displacement; and causing the laser beam to impinge the substrate at the surface, wherein the laser beam inscribes the textual information at the surface by altering a reflective characteristic of the surface, wherein the textual information has an aspect ratio and a line width in accordance with the angular displacement.

16. The method as recited in claim 15, wherein the laser is a pulse modulated UV type laser.

17. The method as recited in claim 15, wherein the aspect ratio corresponds to an energy of the laser and a frequency of pulse modulation.

18. The method as recited in claim 15, wherein an anodic oxide layer overlays the surface.

19. The method as recited in claim 18, wherein the anodic oxide layer is sufficiently transparent to the laser beam such that the laser beam is capable of passing through the anodic oxide layer to impinge the surface.

20. The method as recited in claim 15, wherein the information includes at least one of a serial number, or a model number, or a part number.

* * * * *